United States Patent
Joshi et al.

(10) Patent No.: US 7,087,452 B2
(45) Date of Patent: Aug. 8, 2006

(54) EDGE ARRANGEMENTS FOR INTEGRATED CIRCUIT CHIPS

(75) Inventors: Subhash M. Joshi, Hillsboro, OR (US); Tom P. Leavy, Mullingar (IE); Binny Arcot, West Linn, OR (US); Jun He, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/419,759

(22) Filed: Apr. 22, 2003

(65) Prior Publication Data

US 2004/0212047 A1    Oct. 28, 2004

(51) Int. Cl.
*H01L 21/00* (2006.01)

(52) U.S. Cl. .................. 438/68; 438/113; 438/460; 438/462; 438/463

(58) Field of Classification Search ............... 438/68, 438/107, 113, 460–465
See application file for complete search history.

(56) References Cited

U.S. PATENT DOCUMENTS

| 5,024,970 A | * | 6/1991 | Mori ........................ 438/462 |
| 6,022,791 A | * | 2/2000 | Cook et al. ................ 438/458 |
| 6,383,893 B1 | * | 5/2002 | Begle et al. ............... 438/460 |
| 6,794,272 B1 | * | 9/2004 | Turner et al. .............. 438/459 |

* cited by examiner

*Primary Examiner*—Wael Fahmy
*Assistant Examiner*—Wai-Sing Louie
(74) *Attorney, Agent, or Firm*—Blayne D. Green

(57) ABSTRACT

A method is provided for forming microelectronic devices. This may include providing a wafer device having metallization layers, a plurality of integrated circuits and a channel area provided around each of the integrated circuits. Materials from within each channel area may be removed by etching or by laser to form an air gap around a perimeter of each integrated circuit. Each air gap may prevent cracking and/or delamination problems caused by a subsequent dicing of the wafer device by a wafer saw into a plurality of devices.

17 Claims, 17 Drawing Sheets

EDGE ARRANGEMENTS FOR INTEGRATED CIRCUIT CHIPS

FIELD

The present invention is directed to edge arrangements for integrated circuit (IC) chips.

BACKGROUND

In the production of microelectronic devices, integrated circuitry may be formed in and on semiconductor wafers. Semiconductor wafers may be composed primarily of silicon, although other materials such as gallium arsenide and indium phosphide may be used. As shown in FIG. 1, a single microelectronic device wafer 10 may contain a plurality of integrated circuits (ICs) 12, that may be substantially rectangular and arranged in rows and columns. Two sets of mutually parallel scribe streets 14 may extend perpendicular to each other over substantially the entire surface of the semiconductor wafer 10 between each discrete integrated circuit 12. Scribe streets may also be referred to as scribe lines.

After the integrated circuits 12 have been subjected to preliminary testing for functionality (wafer sort), the microelectronic device wafer 10 may be diced (or cut apart) so that each area of functioning integrated circuitry 12 becomes a microelectronic die that can be used to form a packaged microelectronic device. One example microelectronic wafer dicing process uses a circular diamond-impregnated dicing saw that travels down two mutually perpendicular sets of scribe streets 14 lying between each of the rows and columns. The scribe streets 14 are sized to allow passage of a wafer saw blade between adjacent integrated circuits 12 without causing damage to the circuitry.

As shown in FIGS. 2 and 3, the microelectronic device wafer 10 may also include guard rings 16 that substantially surround the integrated circuits 12. As shown in FIG. 3, the guard rings 16 may extend through a plurality of metallization layers 18. The metallization layers 18 may include layers of metal traces separated by layers of dielectric material layers on a semiconductor wafer 20. The metallization layers 18 provide routes for electrical communication between integrated circuit components within the integrated circuits 12. The guard ring 16 may be formed layer by layer as each of the metallization layers 18 is formed. The guard ring 16 may assist in preventing external contamination encroaching into the integrated circuitry 12 between the metallization layers 18.

Prior to dicing, the microelectronic device wafer 10 may be mounted onto a sticky, flexible tape 22 (shown in FIG. 3) that is attached to a ridge frame (not shown). The tape 22 may continue to hold the microelectronic die after the dicing operation and during transport to the next assembly operation. As shown in FIGS. 4 and 5, the saw may cut a channel 24 in the scribe street 14 through the metallization layers 18 and the semiconductor wafer 20. During cutting, the saw may cut into the tape 22 up to about one-third of its thickness, for example.

However, in the dicing of microelectronic device wafers 10, the use of industry standard dicing saws (metal impregnated with diamond) may result in a rough edge along the metallization layers 12. This may be more prevalent with a metallization layer having ductile copper traces. This rough edge is a source of crack propagation into and/or delamination of the metallization layers 18, through the guard ring 16, and into the integrated circuitry 12 causing fatal defects. These defects may increase as the device material properties move toward weaker adhesions and strengths in order to meet various electrical property requirements.

Therefore, it would be advantageous to develop techniques to effectively dice microelectronic device wafers while reducing or substantially eliminating the possibility of crack and delamination propagation.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
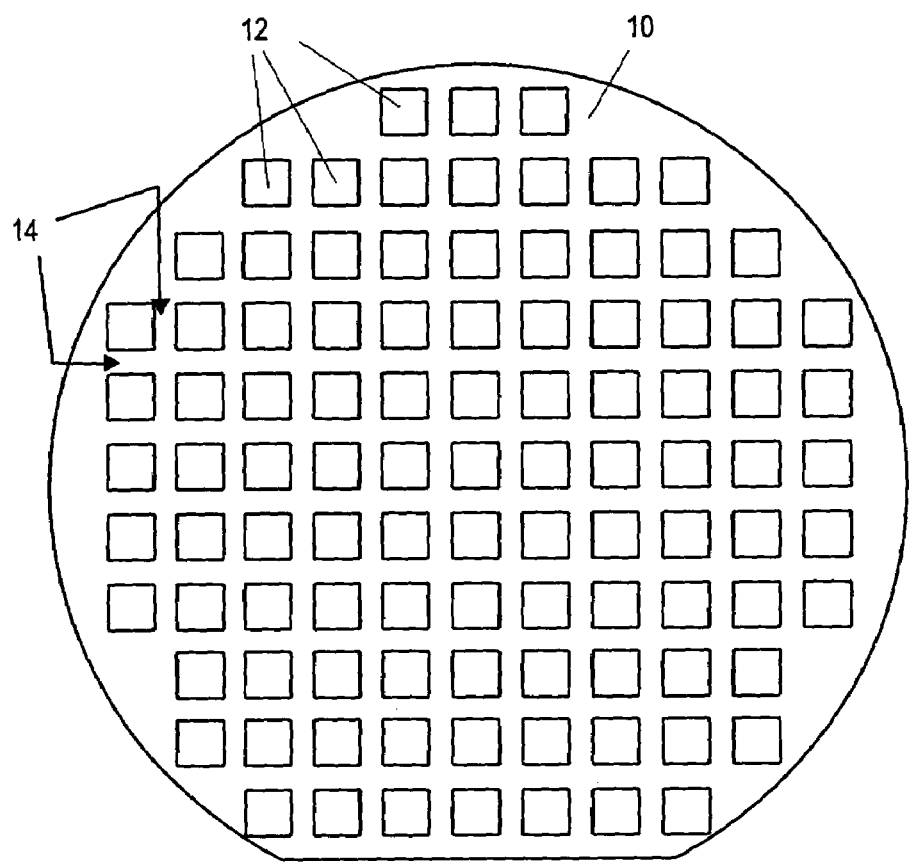
FIG. 1 is a top plan view of a microelectronic device wafer having a plurality of microelectronic devices.

In the following detailed description, like reference numerals and characters may be used to designate identical, corresponding or similar components in differing figure drawings. Further, in the detailed description to follow, example values may be given, although the present invention is not limited to the same. Where specific details are set forth in order to describe example embodiments of the invention, it should be apparent to one skilled in the art that the invention can be practiced without, or with variation of, these specific details.

Embodiments of the present invention may provide a method for forming microelectronic devices. This may include providing a wafer device having metallization layers, a plurality of integrated circuits and a channel area provided around each of the integrated circuits. Materials from within each channel area may be removed by etching or by laser to form an air gap around a perimeter of each integrated circuit. Each air gap may prevent cracking and/or delamination problems caused by a subsequent dicing by a wafer saw.

Figure 2:
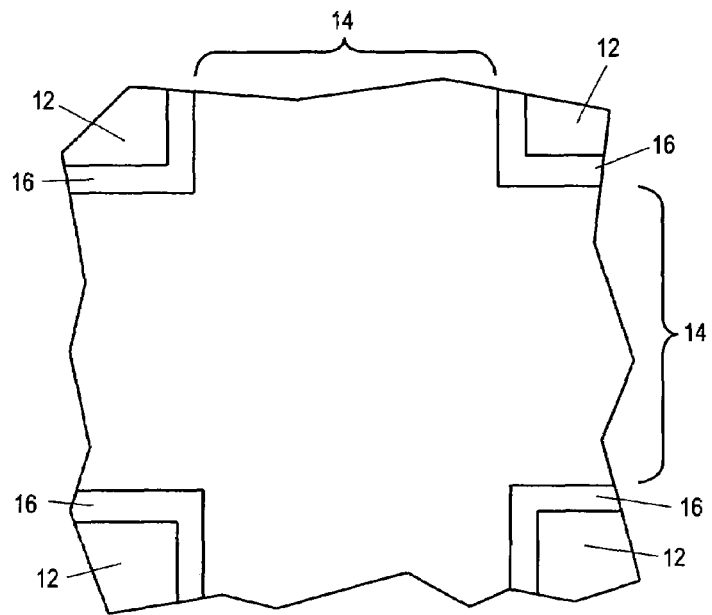
FIG. 2 is a top plan close-up view of one section of the wafer shown in FIG. 1.
Figure 3:
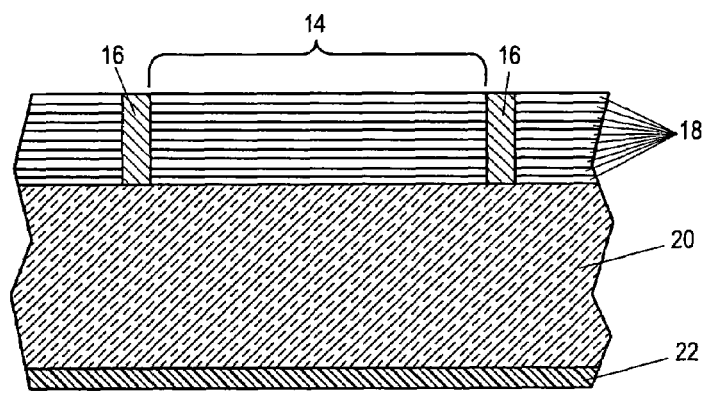
FIG. 3 is a side cross-sectional view of the scribe street areas of the microelectronic device wafer shown in FIG. 1.
Figure 4:
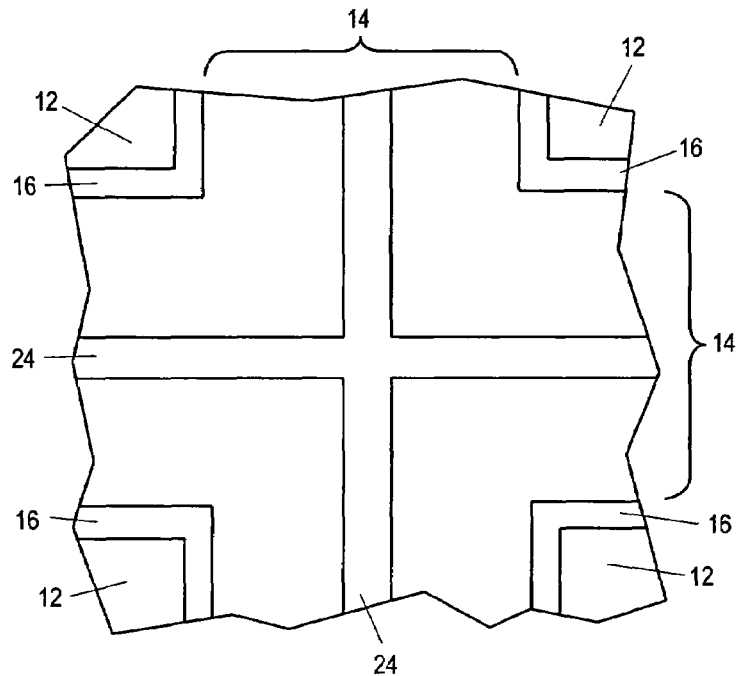
FIG. 4 is a top plan view of the microelectronic device wafer of FIGS. 1 and 2 after wafer dicing.
Figure 5:
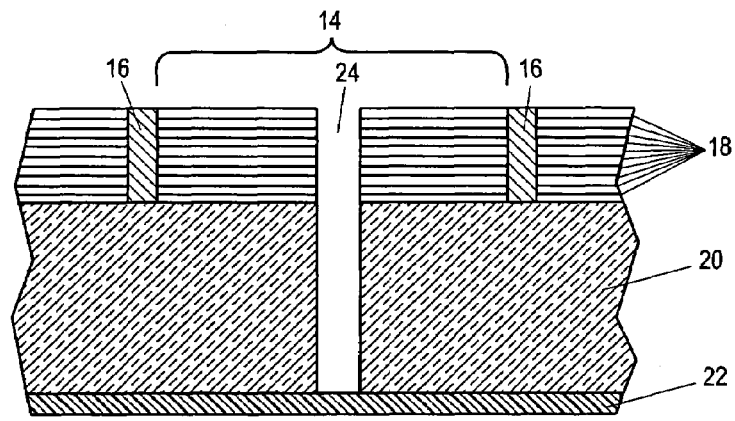
FIG. 5 is a side cross-sectional view of the scribe street areas of the microelectronic device wafer shown in FIG. 4.
Figure 6:
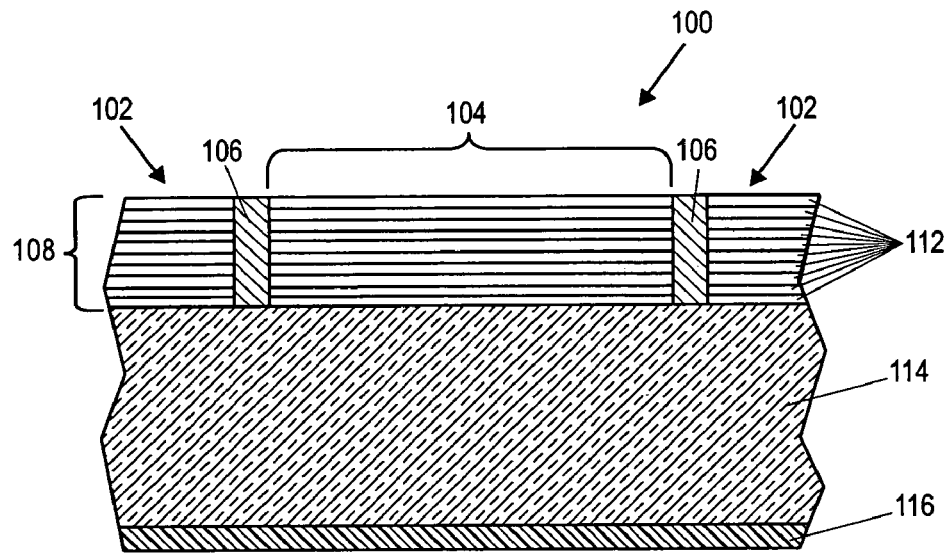
FIG. 6 is a side cross-sectional view of a microelectronic device wafer.

FIG. 6 illustrates a microelectronic device wafer 100 according to one arrangement. Other arrangements are also possible. The device wafer 100 may be similar to the microelectronic device wafer 10 of FIGS. 2 and 3. The device wafer 100 may have a semiconductor wafer 114, including, but not limited to, silicon, gallium arsenide and indium phosphide, mounted onto a sticky, flexible tape 116 and a plurality of metallization layers 112 disposed on the semiconductor wafer 114. It is, of course, understood that the use of the term "wafer" may not only include an entire wafer, but may also include portions thereof.

The metallization layers 112 may be alternating layers of dielectric material, (e.g. silicon dioxide, silicon nitride, epoxy resin, polyimide, bisbenzocyclobutene, and the like) and layers of patterned electrically conductive material, (e.g. copper, aluminum, and the like). The methods and processes for fabricating the metallization layers 112 are known to those skilled in the art.

In a similar manner as described above, a plurality of scribe streets 104 may separate individual integrated circuitry 102. The scribe streets 104 may run perpendicularly to separate the integrated circuitry 102 into rows and columns. At least one guard ring 106 may isolate the integrated circuitry 102 from the scribe streets 104.

Figure 7:
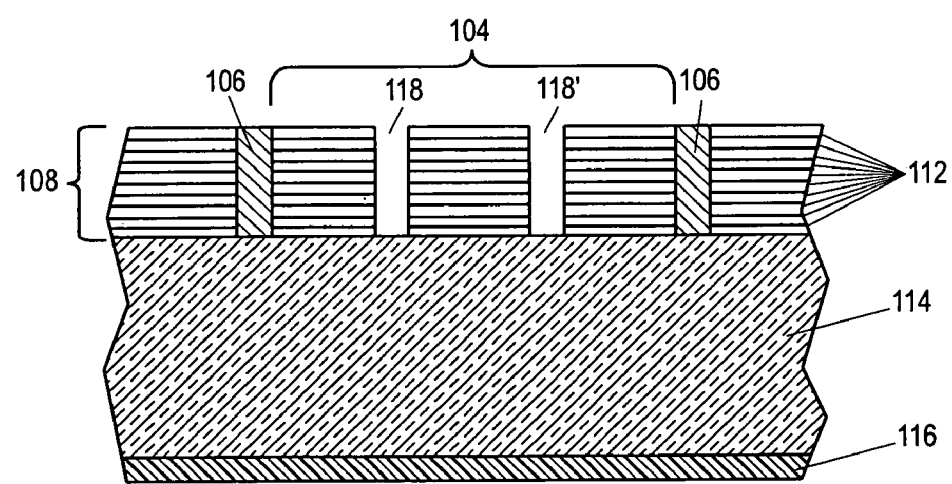
FIG. 7 is a side cross-sectional view of dual defect prevention trenches formed by a laser in the metallization layers of a microelectronic device wafer scribe street area.
Figure 8:
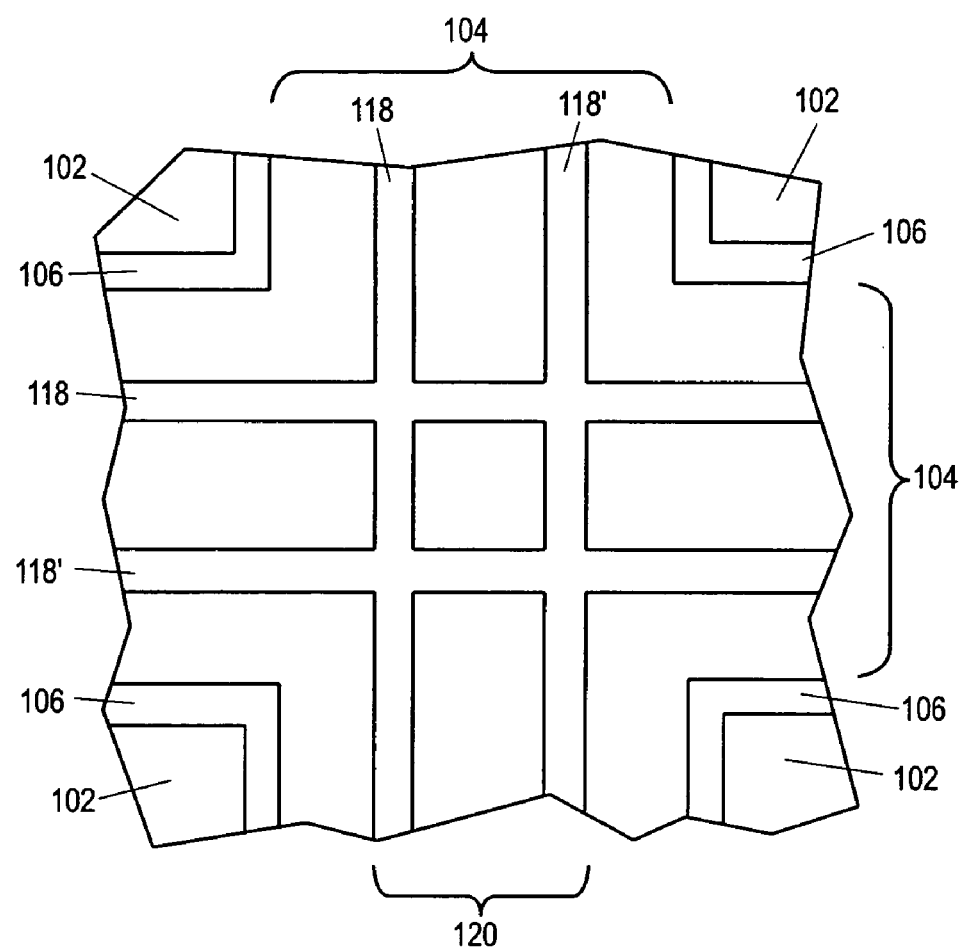
FIG. 8 is a top plan view of the dual defect prevention trenches of FIG. 7.

A laser, such as a YAG Laser (amplifying medium of yttrium aluminium garnet) may ablate away two trenches on each of the scribe streets 104 (both row and column). The two trenches may include (FIG. 7) a first trench 118 and a second trench 118'. Each of the trenches 118 and 118' may be approximately 80 microns wide, for example. The first trench 118 and the second trench 118' may be positioned to reside on either side of the scribe street 104 where a saw may cut when dicing the microelectronic device wafer 100 as shown in FIGS. 7 and 8. The first trench 118 and the second trench 118' may extend completely through all the metallization layers 112. The process parameters (e.g. the type of laser, power settings thereof, duration of ablation, and width of the ablation line) may vary depending on the type of dielectric material layers and conductive material layers.

In the past, lasers have generally not been used in microelectronic device wafer dicing since the lasers cut/ablate too slowly through the entire microelectronic device wafer. Furthermore, laser ablation may generate debris that can cause contamination of microelectronic device wafers and processing equipment. However, it has been determined that the laser may cut quickly through the metallization layers 112 with a minimum of debris. Since a laser may cut/ablate smooth-sided trenches, the first trench 118 and the second trench 118' may not propagate cracks in or cause delamination of the metallization layers 112. Additionally, since the potential defect origination points that will be generated by the wafer saw are isolated by the first trench 118 and the second trench 118', such defects may cease to be an issue.

Figure 9:
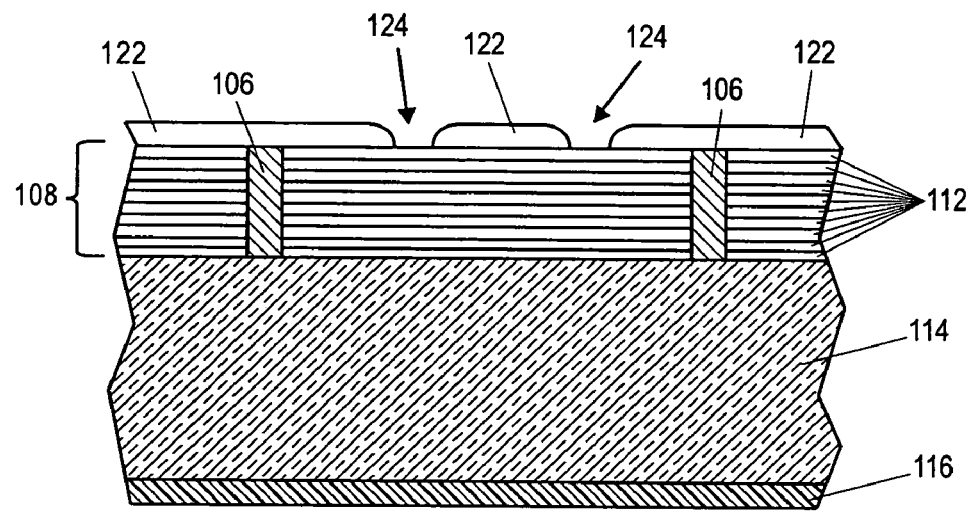
FIGS. 9 and 10 are side cross-sectional views of the dual defect prevention trenches formed by etching of the metallization layers of a microelectronic device wafer.
Figure 10:
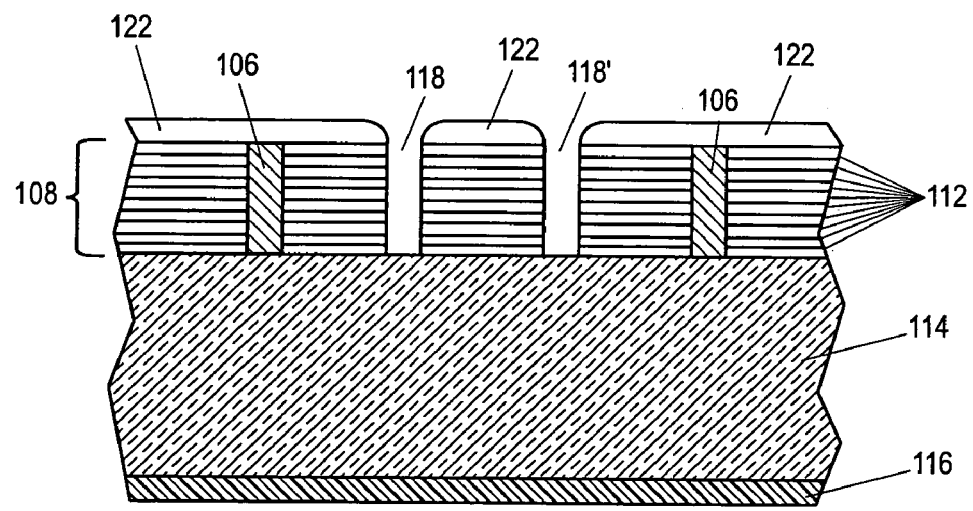

FIGS. 9 and 10 are side cross-sectional views of the dual defect prevention trenches formed by etching of the metallization layers. FIGS. 9 and 10 relate to an etching technique used to form the first trench 118 and the second trench 118' according to one arrangement. Other arrangements are also possible. Such an etching process may utilize processes well-known in the art. For example, a resist material 122 may be applied and patterned on the metallization layers 112 such that openings 124 are created in areas where a trench is desired as shown in FIG. 9. The metallization layers 112 may then be etched to form the first trench 118 and the second trench 118' through to the semiconductor wafer 114 as shown in FIG. 10. It is, of course, understood that multiple etching operations and/or different etching materials may be utilized depending on the selected dielectric layer materials and the conductive layer materials.

Figure 11:
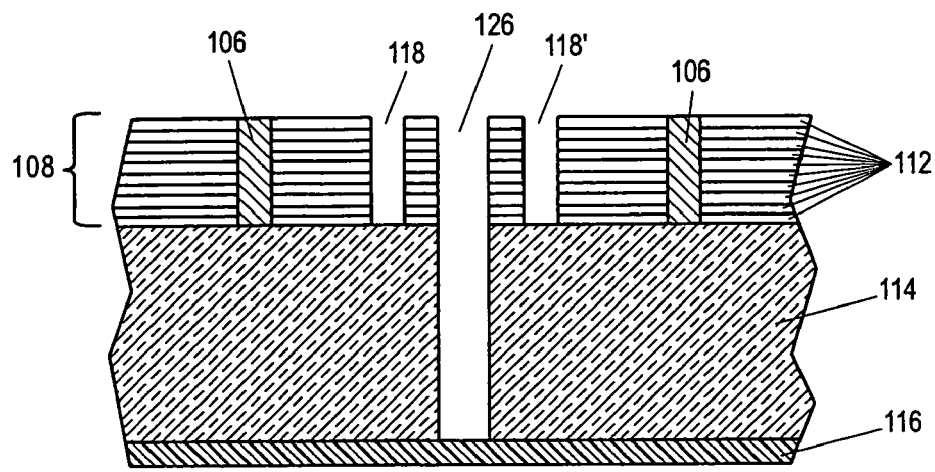
FIG. 11 is a side cross-sectional view of the microelectronic device wafer of FIGS. 7 and 8 or of FIGS. 9 and 10 after wafer dicing.
Figure 12:
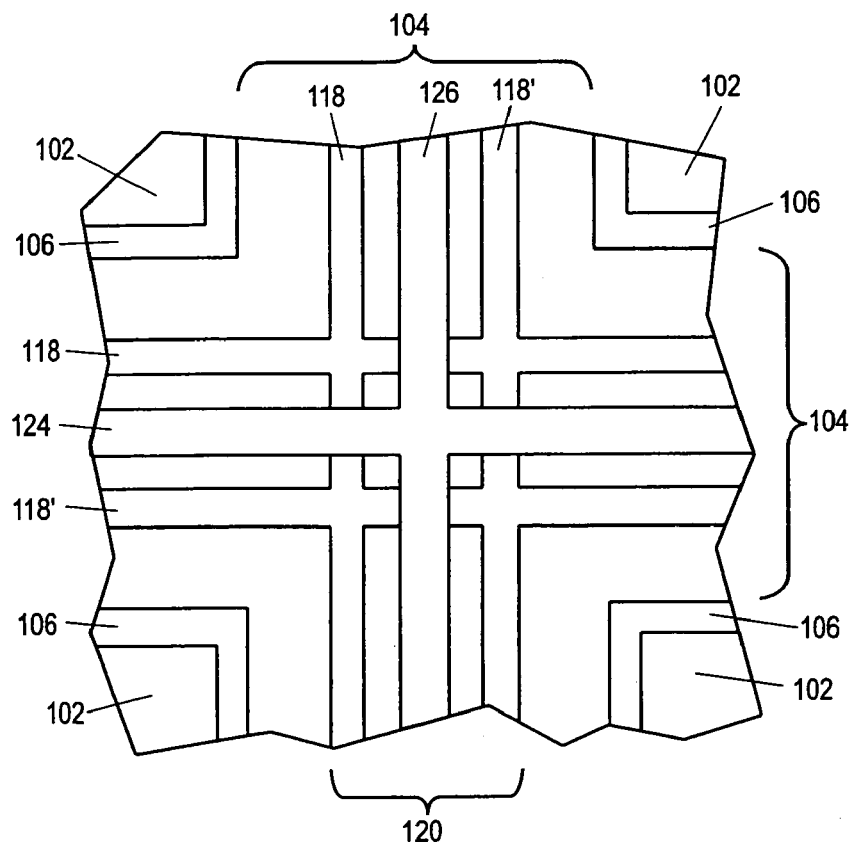
FIG. 12 is a top plan view of the microelectronic device wafer of FIG. 11.

After the formation of the first trench 118 and the second trench 118' and, if an etching process is used, after the removal of the resist material 122, a wafer saw may cut a channel 126 between the first trench 118 and the second trench 118', through the metallization layers 112, and through the semiconductor wafer 114, as shown in FIGS. 11 and 12. Of course, the width of the saw cut (kerf) is smaller than a distance 120 between the first trench 118 and the second trench 118'.

Rather than forming two individual trenches as shown in FIGS. 7–12, a single, wide trench 128 may be formed as shown in FIGS. 13–18. The wide trench 128 may be wide enough to eliminate any interaction of a wafer saw and the metallization layers 112 during the dicing of the microelectronic device wafer. The elimination of any interaction between the wafer saw and the metallization layers 112 may eliminate or minimize the potential of any defects being generated in the metallization layers 112 by the wafer saw.

Figure 13:
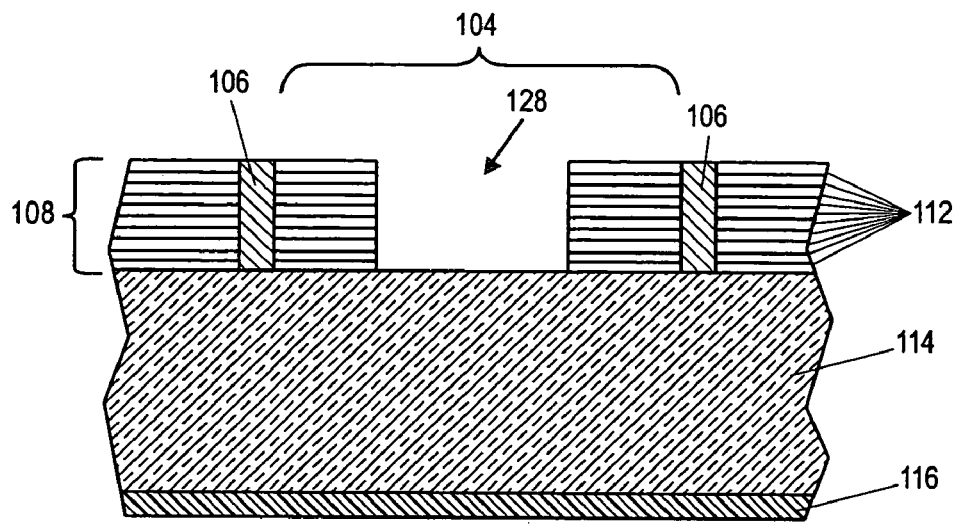
FIG. 13 is a side cross-sectional view of a single defect prevention trench formed by a laser in the metallization layers of the microelectronic device wafer scribe street area.
Figure 14:
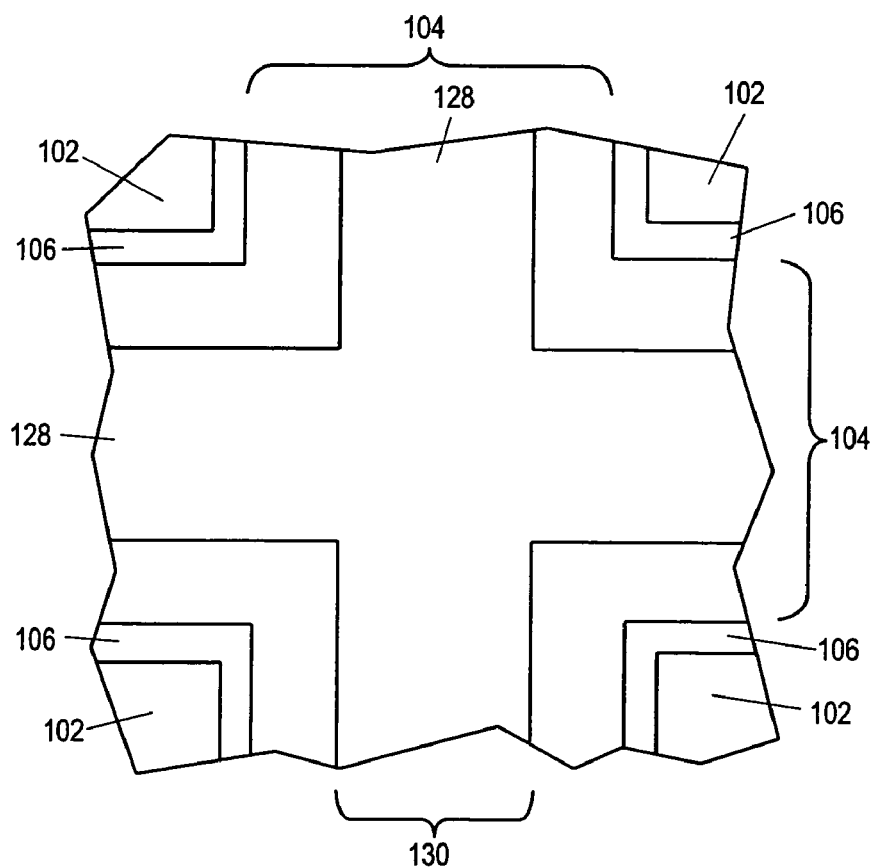
FIG. 14 is a top plan view of the single defect prevention trench of FIG. 13.
Figure 15:
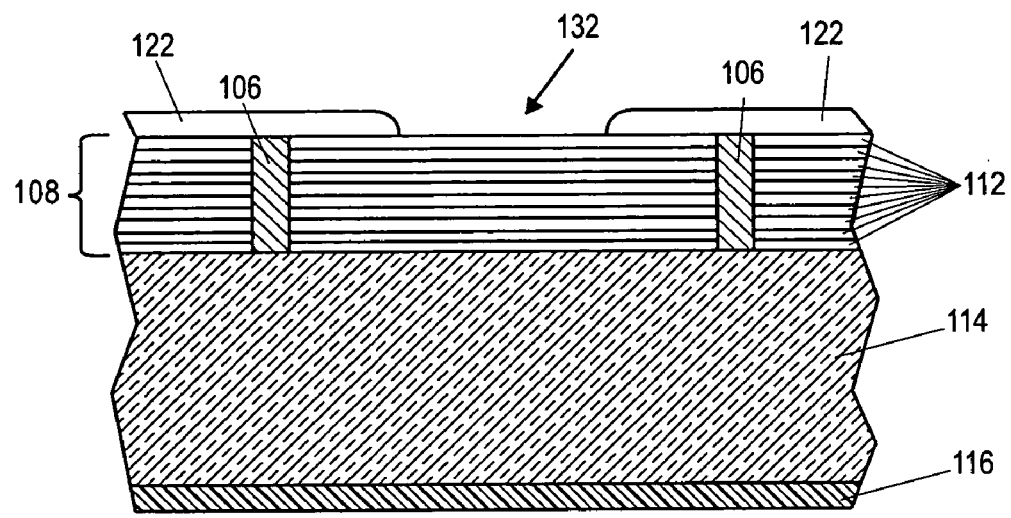
FIGS. 15 and 16 are side cross-sectional views of the single defect prevention trench formed by etching of the metallization layers of the microelectronic device wafer.
Figure 16:
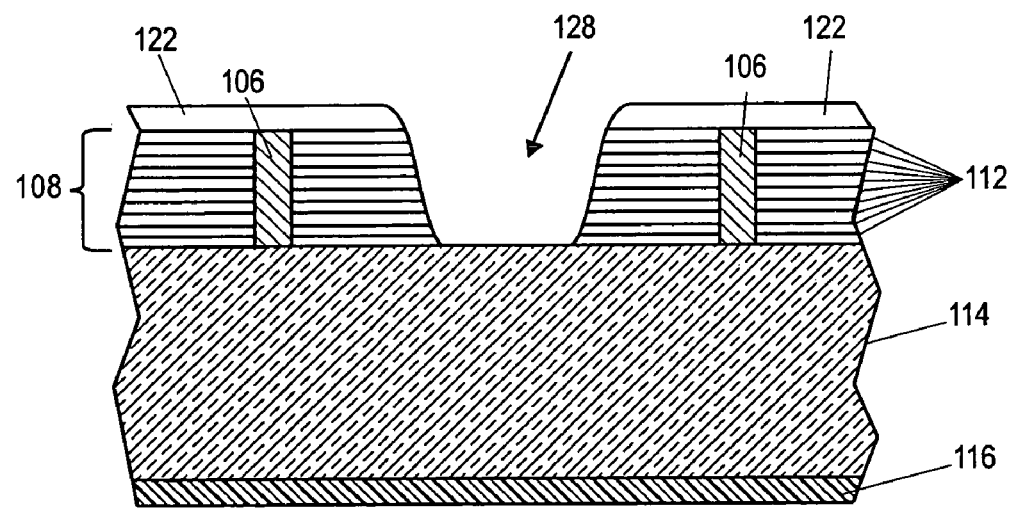
Figure 17:
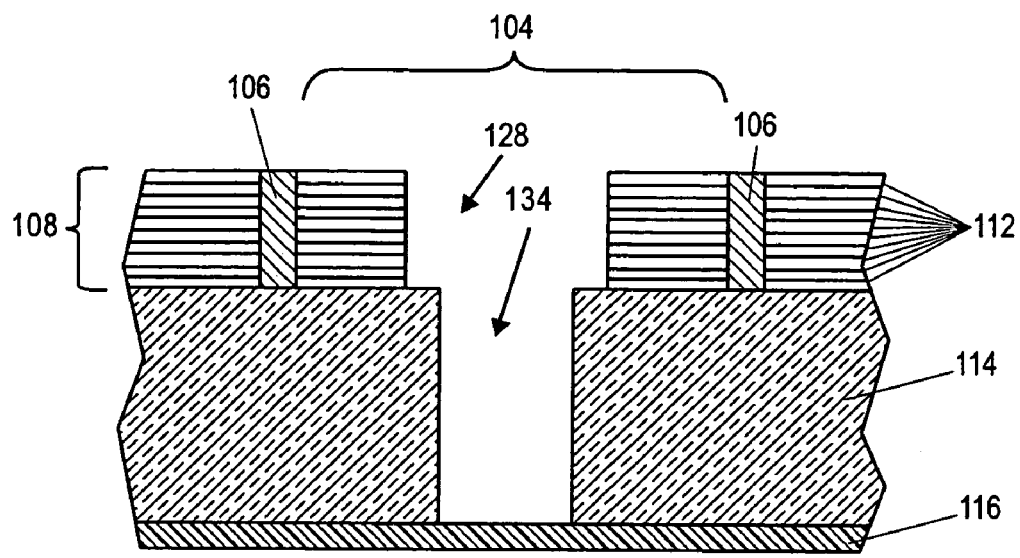
FIG. 17 is a side cross-sectional view of the microelectronic device wafer of FIGS. 13 and 14 or of FIGS. 15 and 16 after wafer dicing.
Figure 18:
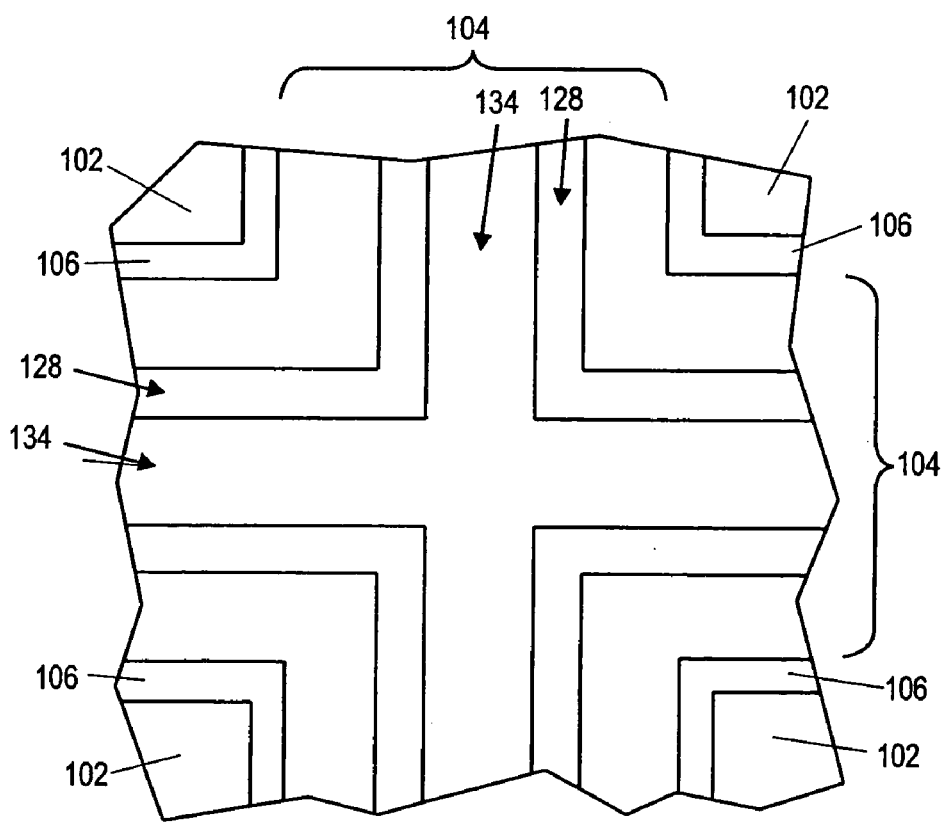
FIG. 18 is a top plan view of the microelectronic device wafer of FIG. 17.

As shown in FIGS. 13 and 14, the single wide trench 128 may be formed by a laser in a similar manner as discussed above. As shown in FIGS. 15 and 16, the single wide trench 128 may also be formed by etching in a similar manner as discussed above, or by any method of forming such a trench as is known in the art. After the formation of the wide trench 128 and, if an etching process is used, after the removal of the resist material 122, a wafer saw may be placed within the wide trench 128. The laser may cut a channel 134 through the semiconductor wafer 114 as shown in FIGS. 17 and 18. The kerf of the saw cut is smaller than the width 130 of the wide trench 128.

Although the trenches may be formed before the microelectronic device wafer is diced, the trenches may also be formed after dicing.

Embodiments of the present invention may relate to a die design and integrated process flow for incorporation of a continuous air gap around a perimeter of an interconnect stack on an integrated circuit chip. The air gap may block the propagation of mechanical defects from the edge of the chip to the active circuitry in an interior of the chip. For example, embodiments of the present invention may involve the design of a continuous channel of dielectric material around the perimeter of each chip on a wafer. The channel may be completely enclosed by interconnect metal walls on either side and open on the top. The channel of dielectric may be selectively etched without etching the channel walls and without interfering with subsequent processing and testing. Another embodiment of the present invention may include a continuous channel of metal enclosed by dielectric walls. The channel of metal may be selectively etched without etching the dielectric walls.

Embodiments of the present invention may also form an air gap by use of a laser. These embodiments may utilize a laser cutting path as will be described below with respect to FIGS. 26–29.

Figure 19:
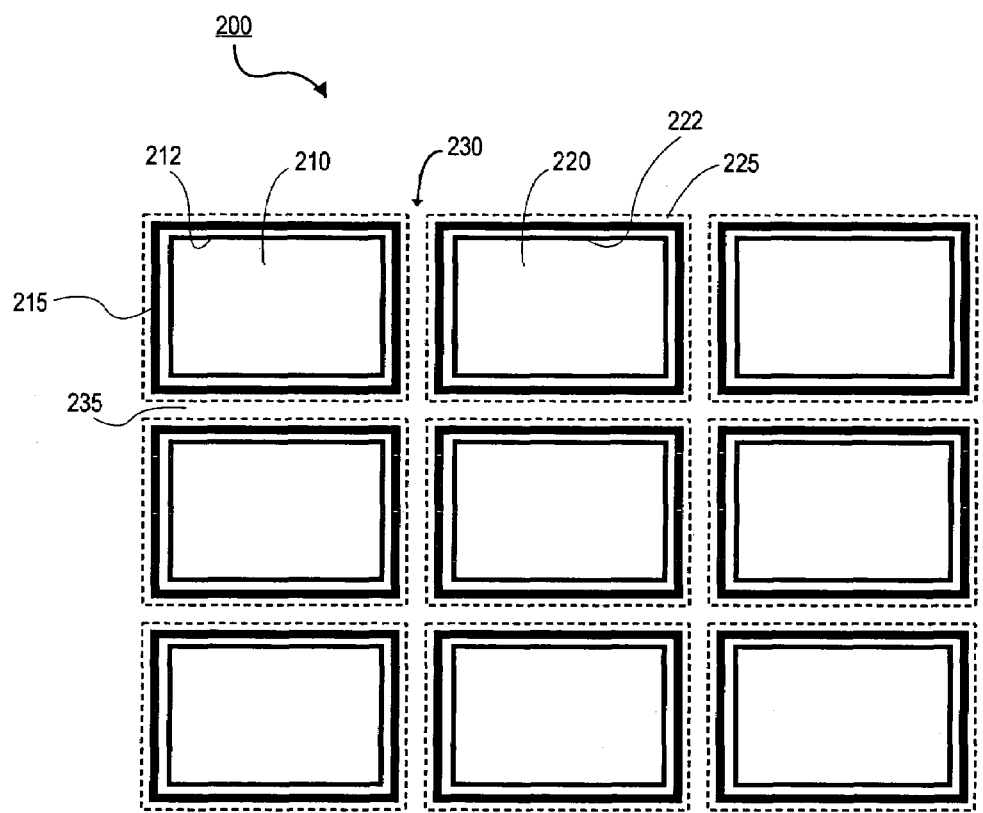
FIG. 19 is a top view of a die array on a wafer according to an example embodiment of the present invention.

FIG. 19 is a top view of a die array on a wafer according to an example embodiment of the present invention. Other embodiments and configurations are also within the scope of the present invention. More particularly, FIG. 19 shows a die array 200 that includes nine active die areas. For ease of illustration, only a first active area 210 and a second active area 220 are labeled. The respective active areas (including the first active area 210 and the second active area 220) may be separated by an inactive area 230 or a plurality of inactive areas. FIG. 19 also show a scribe street 235 similar to the scribe street 104 described above with respect to FIG. 6.

The first active area 210 may be associated with a metal guard 212 provided around a perimeter of the active area of the first active area 210. The active circuitry may be provided inside of the metal guard 212. A continuous air gap 215 may be provided around an exterior of the metal guard 212. The second active area 220 may be associated with a metal guard 222 provided around a perimeter of the second active area 220. The active circuitry may be provided inside of the metal guard 222. A continuous air gap 225 may be provided around an exterior of the metal guard 222. Separate continuous air gaps may be formed around each of the active areas of the die array 200.

Figure 20:
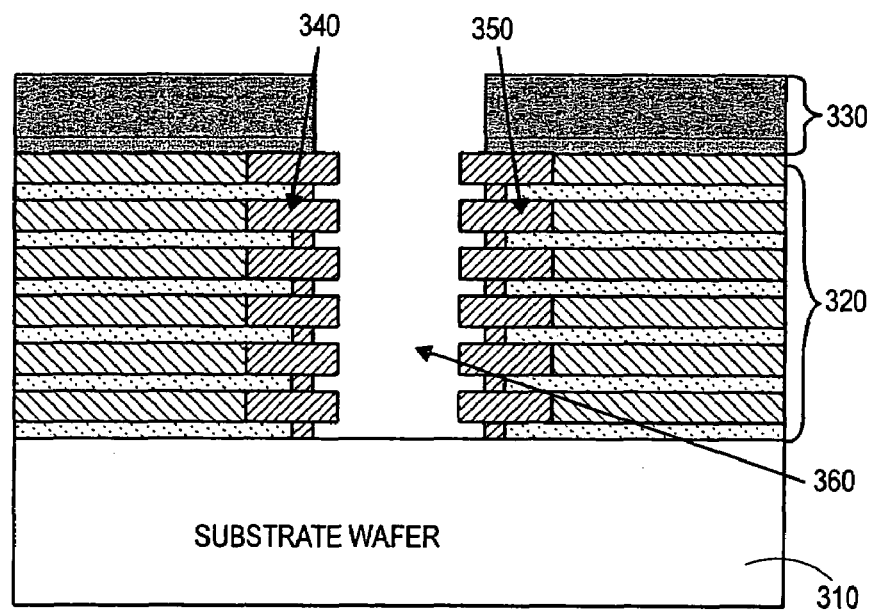
FIG. 20 is a side view of a wafer according to an example embodiment of the present invention.

FIG. 20 is a side view of a wafer according to an example embodiment of the present invention. Other embodiments and configurations are also within the scope of the present invention. More specifically, FIG. 20 shows a substrate wafer 310 on which is provided an inter-layer dielectric stack 320 and passivation layers 330. FIG. 20 also shows a first metal wall 340 and a second metal wall 350 provided along sides of the inter-layer dielectric stack 320 so as to provide (or form) an air gap 360. The air gap 360 may block crack propagation to active areas of the die. The first metal wall 340 and the second metal wall 350 define sidewalls of the air gap 360 between the first metal wall 340 and the second metal wall 350. The air gap 360 may be formed by etching out the dielectric material between the two continuous walls of the interconnect metal (such as the first metal wall 340 and the second metal wall 350) that extends around the perimeter of each die on the wafer. In the FIG. 20 embodiment, each of the first metal wall 340 and the second metal wall 350 may be patterned to have a zigzag type of vertical pattern. This zigzag type of pattern may be based on different applications of patterning design rules.

Figure 21:
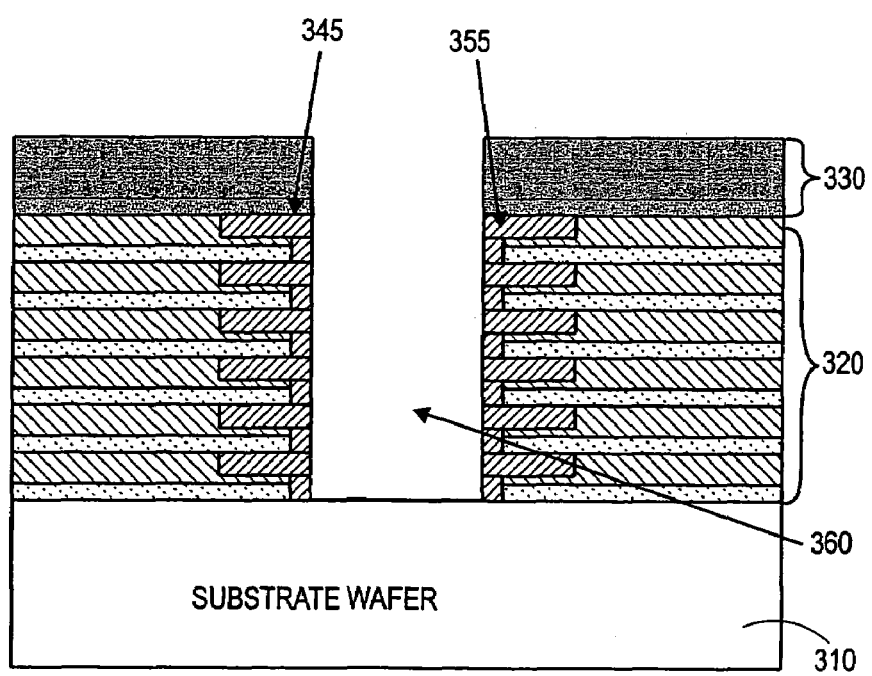
FIG. 21 is a side view of a wafer according to an example embodiment of the present invention.

FIG. 21 is a side view of a wafer according to an example embodiment of the present invention. Other embodiments and configurations are also within the scope of the present invention. More particularly, FIG. 21 shows a first metal wall 345 provided as a relatively smooth or straight sidewall on one side of the air gap 360 and a second metal wall 355 provided as a relatively smooth or straight sidewall on the other side of the air gap 360. The air gap 360 may be defined by the two continuous walls of interconnect metal on either side of the air gap 360 such that the air gap (after etching) may have smooth sidewalls without stress concentration points.

Operations for forming the air gap 360 according to example embodiments of the present invention will now be described with respect to FIGS. 22–25. Other embodiments, operations, and configurations are also within the scope of the present invention.

Figure 22:
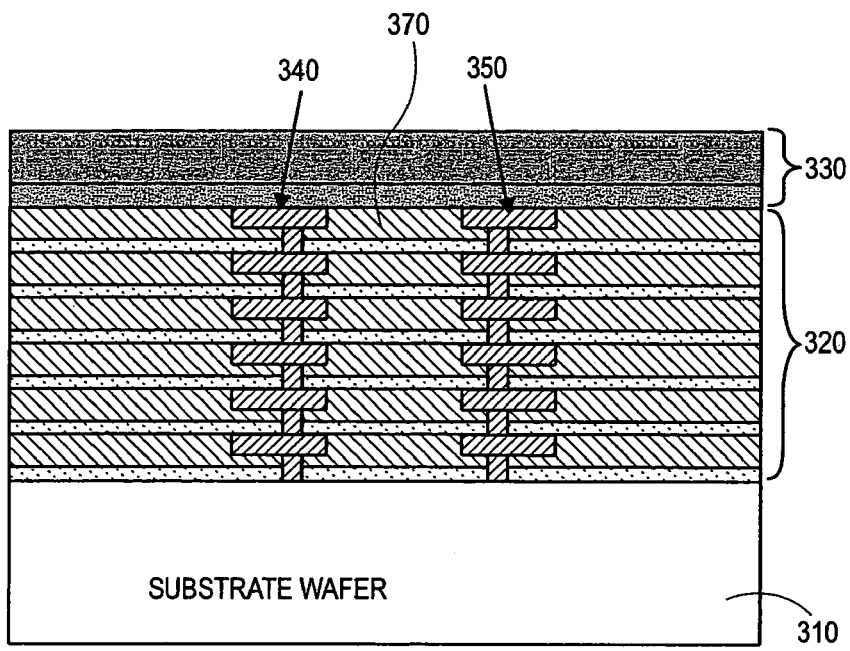
FIG. 22 is a side view of a continuous channel of dielectric enclosed by continuous metal walls according to an example embodiment of the present invention.

FIG. 22 is a side view of a continuous channel of dielectric enclosed by side walls according to an example embodiment of the prevent invention. Other embodiments and configurations are also within the scope of the present invention. More particularly, FIG. 22 shows dielectric material 370 provided between the first metal wall 340 and the second metal wall 350 prior to an etching process. The continuous channel provides the dielectric material 370 that is enclosed by the continuous walls (such as the first metal wall 340 and the second metal wall 350) extending around the perimeter of each die of the wafer. The continuous channel of dielectric material is enclosed on both sides by a continuous interconnect metal wall.

Figure 23:
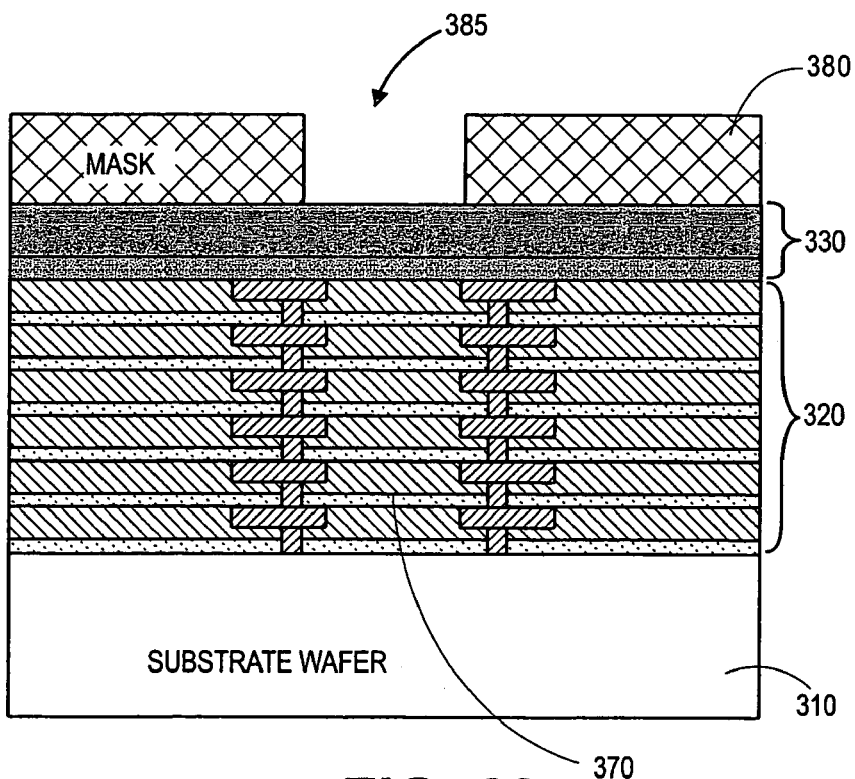
FIG. 23 shows the structure of FIG. 22 including a mask according to an example embodiment of the present invention.

FIG. 23 is a side view of a continuous channel of dielectric enclosed by sidewalls as shown in FIG. 22 and also including a mask according to an example embodiment of the present invention. Other embodiments and configurations are also within the scope of the present invention. More particularly, FIG. 23 shows a mask 380 provided on the passivation layer 330. The mask 380 may include an opening 385 for etching the air gap (such as the air gap 360) in the interconnect stack. In this embodiment, the opening 385 may be provided over the dielectric material 370. The opening 385 allows the etching of the dielectric material 370 to form the air gap.

Embodiments of the present invention may provide a process that allows selective etching out of the dielectric channel between the metal walls without affecting other parts of the interconnect stack in the die. As shown in FIG. 23, this process sequence may include a masking operation that exposes the dielectric channel to the subsequent etch process while protecting the remainder of the die. An etch process may selectively etch out the dielectric material while not etching the metal walls of the channel. The metal walls may play an important role in defining the sidewalls of the channel and thereby enabling the use of an isotropic etch process. The isotropic etch process may be much simpler than an anisotropic etch process employed in advanced semiconductor processing to etch features with vertical sidewalls. Either a wet etch process or dry etch process may be employed.

FIG. 23 shows that the air gap is being patterned in both the passivation layer 330 and the dielectric stack 320 in the same masking and etch operations. However, the passivation layer 330 may also be patterned by separate masking/etching operations, or alternately, the air gap in the dielectric stack 320 may be patterned prior to the deposition and patterning of the passivation layer 330. Any alternative process flow consistent with the design and architecture may also be used. Following the etching of the dielectric channel, the mask 380 may be removed. As a result, a continuous trench or air gap may be formed in the interconnect stack that extends all around the perimeter of each die on the wafer as shown in FIGS. 19 and 20.

Figure 24:
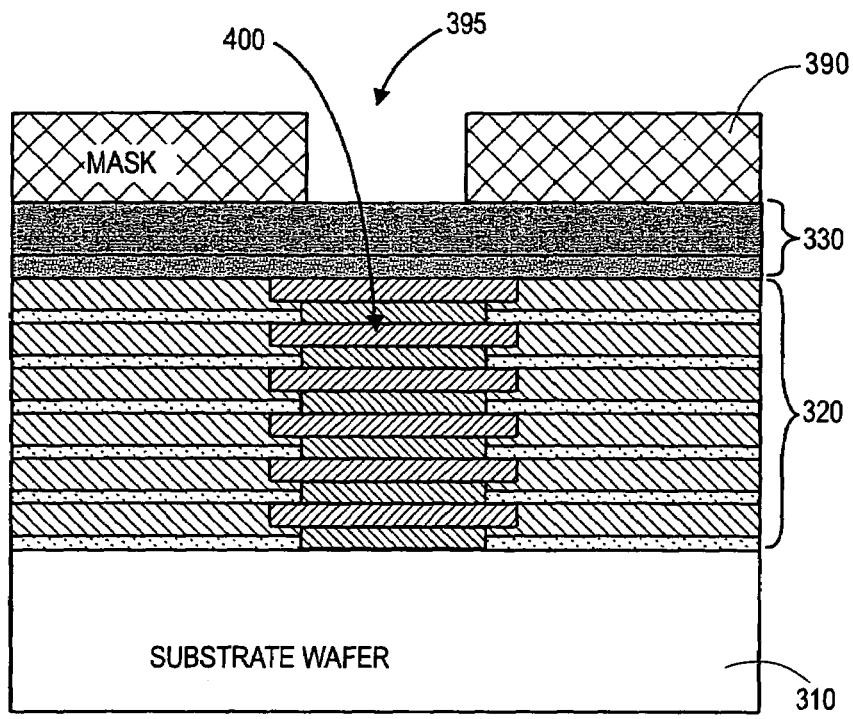
FIG. 24 is a side view of a metal channel and a mask according to an example embodiment of the present invention.

FIG. 24 is a side view of a metal channel and a mask according to an example embodiment of the present invention. Other embodiments and configurations are also within the scope of the present invention. More particularly, FIG. 24 shows a metal channel 400 provided within the inter-layer dielectric stack 320. The metal channel 400 may be etched without etching the dielectric stack 320. For example, a mask 390 may be provided above the metal channel 400 and the dielectric stack 320. The mask 390 may include an opening 395 above the metal channel 400. The opening 395 allows for etching the air gap in the inter-layer dielectric stack 320. The etch may selectively etch the metal channel 400 without etching the dielectric materials forming the sidewalls of the channel. Thus, FIG. 24 shows a design where a continuous metal channel is enclosed by continuous walls of dielectric materials on either side and where an etch that etches the metal (but does not etch the dielectric) may be used to create an air gap around each die.

Figure 25:
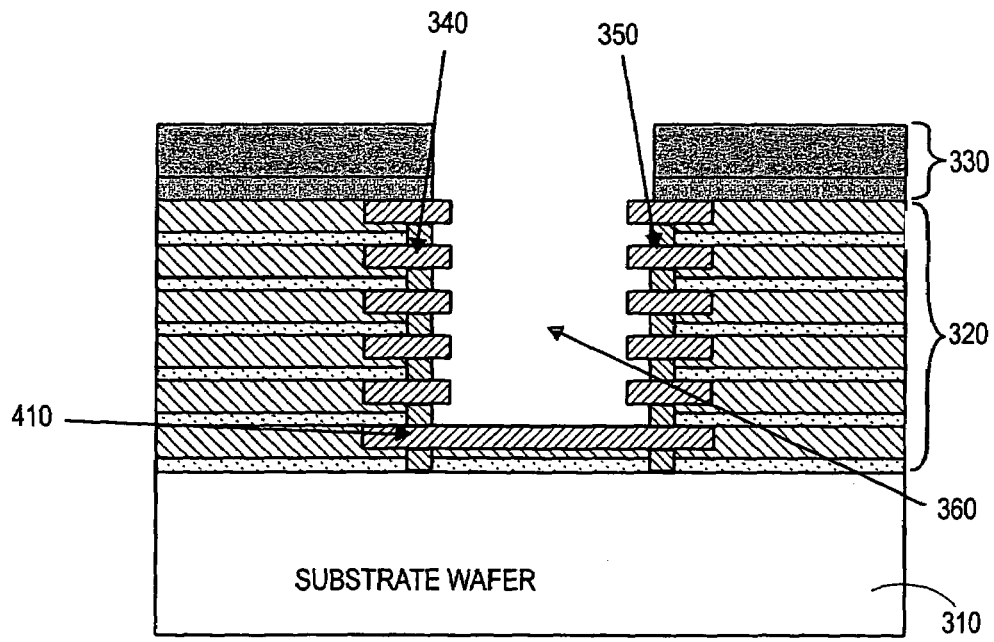
FIG. 25 is a side view of an air gap having a continuous base according to an example embodiment of the present invention.

FIG. 25 is a side view of an air gap having a continuous base 410 according to an example embodiment of the present invention. Other embodiments and configurations are also within the scope of the present invention. More particularly, FIG. 25 shows a metal base 410 provided at a base of the air gap 360 above the substrate wafer 310. The air gap 360 may extend around the perimeter of each die on the wafer. In this embodiment, the air gap 360 may be defined by two continuous walls of interconnect metal (such as the first metal wall 340 and the second metal wall 350) on either side and the metal base 410 underneath the air gap 360. The metal base may help to prevent the etch of the channel from penetrating into the substrate wafer 310.

Embodiments of the present invention may also provide an air gap (or moat) in the interconnect stack by use of a laser before die separation. This may ensure good yield and reliability of IC products that get improved performance through the use of advanced dielectric materials that often have inferior mechanical properties relative to conventional dielectric materials. The air-gap in the interconnect stack may block propagation of cracks and mechanical defects arising from the die separation process, which may otherwise propagate fast at the die edges where thermo-mechanical stresses from flip-chip packaging may be a maximum. However, since the interconnect stack may contain a variety of dielectric, metallic and polymeric materials, all of which may have widely divergent optical properties (e.g., absorption, reflection, transmission coefficients etc.) as well as widely divergent thermo-mechanical properties (e.g. density, specific heat, coefficient of thermal expansion etc.), and since the interconnect design may result in very different distributions of these materials in different parts of the die, it may be difficult to obtain a uniform and defect-free laser cut around each die. Embodiments of the present invention may enable uniform and consistent laser cut quality across the perimeter of each die, and thereby enable good yield and reliability for IC products using advanced interconnect materials.

FIGS. 26–31 are top views of different laser cut paths according to example embodiments of the present invention. The views are of the die corners on the wafer. Other embodiments and configurations are also within the scope of the present invention. FIGS. 26–31 show the continuous path for the laser cut around the die and outside of active die area.

Figure 26:
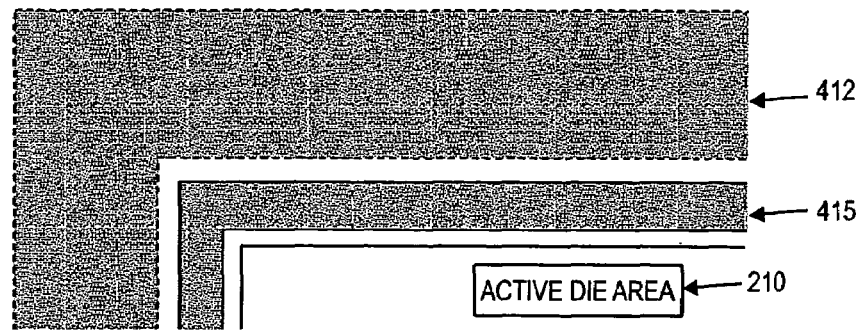
FIG. 26 is a top view of a laser cut path according to an example embodiment of the present invention.

More particularly, FIG. 26 shows a continuous laser cut path 412 provided around a metal guard 415. That is, the laser cut path 412 may be a solid strip of interconnect metal. The metal guard 415 may be similar to the metal guard 212 shown in FIG. 19. The laser cut path 412 and the metal guard 415 may be provided around a perimeter of the active area 210. A similar laser cut path may also be provided around a perimeter of each of the other active areas on the wafer. In particular, the continuous laser cut path 412 may be made of solid metal around each die.

Figure 27:
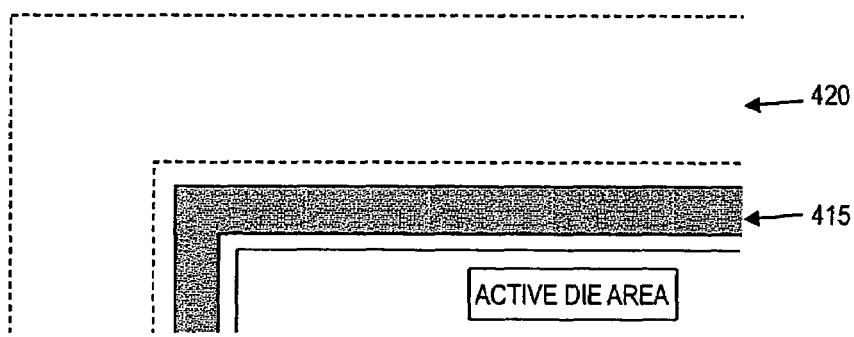
FIG. 27 is a top view of a laser cut path according to an example embodiment of the present invention.
Figure 28:
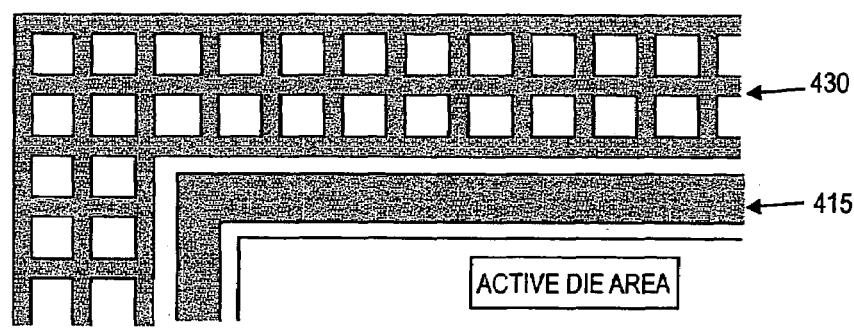
FIG. 28 is a top view of a laser cut path according to an example embodiment of the present invention.
Figure 29:
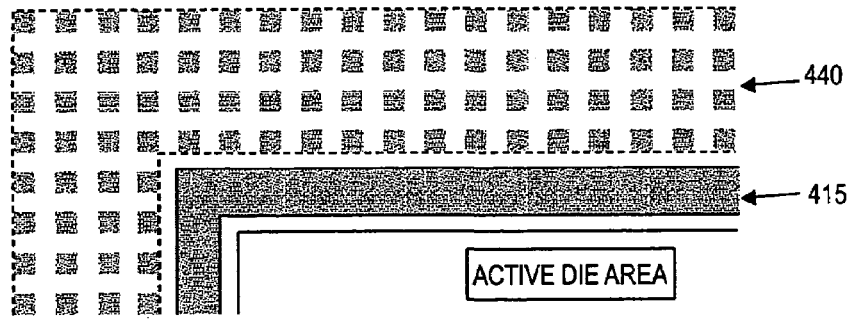
FIG. 29 is a top view of a laser cut path according to an example embodiment of the present invention.
Figure 30:
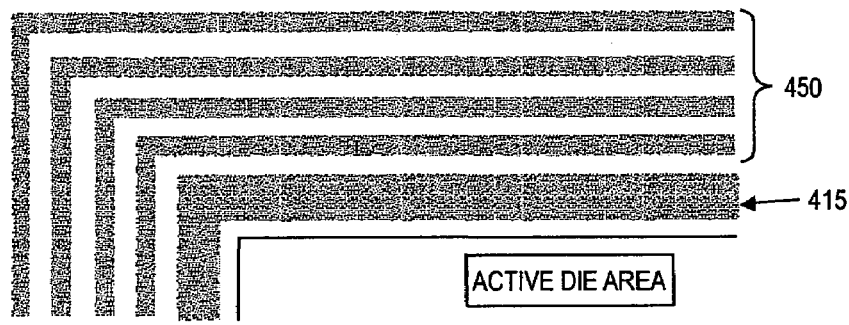
FIG. 30 is a top view of a laser cut path according to an example embodiment of the present invention.
Figure 31:
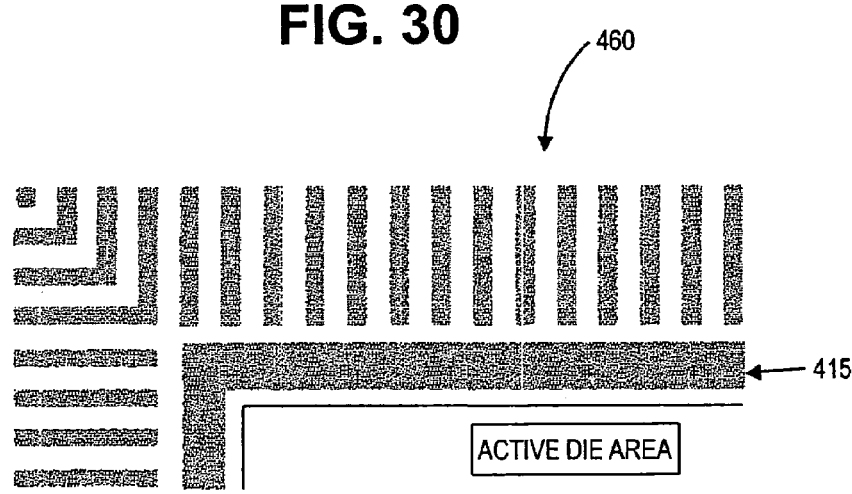
FIG. 31 is a top view of a laser cut path according to an example embodiment of the present invention.

FIG. 27 shows a continuous laser cut path 420 with no metal provided around the metal guard 415. That is, the laser cut path 420 may be a solid strip of inter-layer dielectric without any metal. Additionally, FIG. 28 shows a continuous laser cut path 430 with a metal grid provided around the metal guard 415. The laser cut path 430 may be a grid of interconnect metal embedded in the dielectric. Still further, FIG. 29 shows a continuous laser cut path 440 with a dielectric grid provided around the metal guard 415. The laser cut path 440 may be a grid of interlayer dielectric embedded in metal. FIG. 30 shows continuous laser cut paths 450 with metal stripes parallel to each die edge. FIG. 31 shows continuous laser cut paths 460 with metal stripes perpendicular to each die edge. In each of FIGS. 27–31, the respective laser cut paths 420, 430, 440, 450 and 460 may be provided around a perimeter of the active areas 210. A similar (or different) laser cut path may also be provided around a perimeter of each of the other active areas on the wafer. While each of these figures merely shows a corner area of one die on the wafer, embodiments of the present invention are also applicable to similar or different laser cut paths provided around each of the other dies on the wafer.

Accordingly, embodiments of the present invention may design a cutting path for the laser in the fabrication process so as to provide the laser with a uniform distribution of metal/dielectric. During the design phase, the appropriate metal and dielectric materials may be provided within the laser cut path based on the type of laser and the type of material to be used, for example. Thus, the cutting path may be customized based on the laser and dielectric and interconnect materials so as to optimize the path. This may help avoid non-uniform absorption of the laser.

The shapes and sizes of the patterns within the laser cutting paths are merely exemplary as other shapes and sizes are also within the scope of the present invention. Different layers of the interconnect stack and the laser cut path may use different designs. Additionally, similar locations and the metal structures in the different layers may or may not be connected to each other.

Embodiments of the present invention may provide a continuous and uniform cutting path for the laser in the interconnect stack. The nature and design of the cutting may be modified depending on the dielectric, metallic and polymeric materials in the interconnect stack, and also on the type and wavelength(s) of the laser that is being utilized. To obtain a clean, defect-free cut, the cutting path may have a large volume fraction of the materials that will optically absorb the laser wavelength(s) being used, and may have a low volume fraction of the materials that will optically reflect or transmit the laser wavelength(s). Thus, for a wavelength(s) that is absorbed by metallic materials but not by the dielectric materials, the cutting path may include primarily metal structures (e.g., FIG. 26), and vice versa. For a wavelength(s) that is absorbed by the dielectric materials but not by the metallic materials, the cutting path may primarily include the dielectric materials without any metal patterns (e.g., FIG. 27). A different design may be utilized in different layers of the interconnect stack to account for different materials in the different layers that may have different optical properties. The metal structures in the different layers may or may not be connected to each other. The laser cutting process itself may be designed such that the width of the laser cut may be equal, less or greater than the width of the cutting path, and the laser cut may or may not be centered in the cutting path.

Embodiments of the present invention may be described with respect to dual-damascene type of interconnect architecture with copper, for example, as the interconnect metal and an inter-layer dielectric stack having alternating dielectric and "etch-stop layer" materials (e.g. nitride). However, embodiments of the present invention are not limited to this particular architecture and may apply to any interconnect architecture that includes interconnects embedded in a dielectric stack, with any kind of interconnect and dielectric materials. If copper or some other type of material is used which might potentially tend to migrate and contaminate other areas of the die, one or more passivation layers may be provided to bound such materials so as to prevent or minimize migration.

Figure 32:
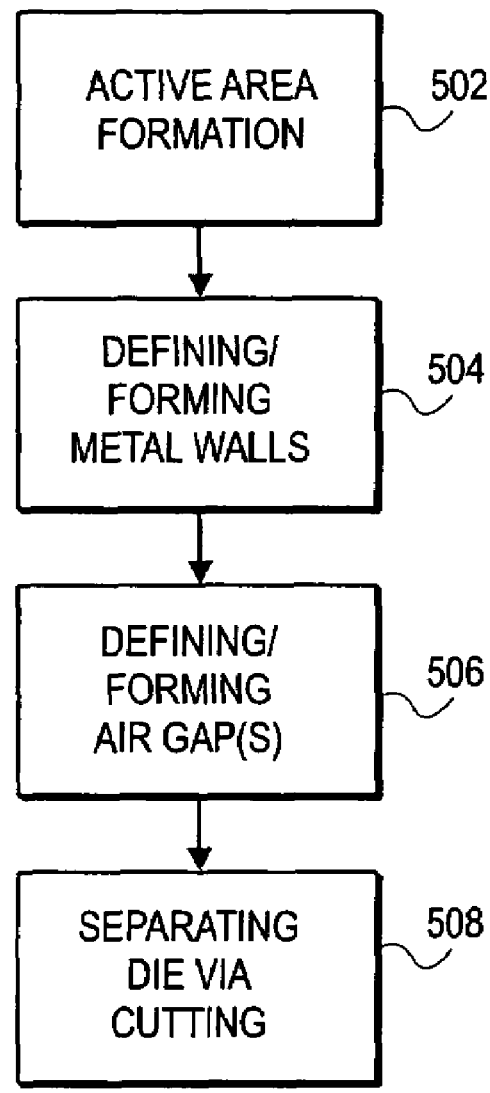
FIG. 32 is a flow chart showing operations according to an example embodiment of the present invention.

FIG. 32 is a flow chart showing operations according to an example embodiment of the present invention. Other embodiments, operations and orders of operations are also within the scope of the present invention. In block 502, the active areas of the integrated circuit may be formed. In block 504, the metal walls may be defined or formed. In block 506, air gaps may be defined or formed. In block 508, the die may be separated by cutting.

A discrete integrated circuit (IC) may be implemented as: part of a chip or chipset embodiment; contained within a chip or chipset of a printed circuit board (e.g., motherboard) embodiment; contained within a chip or chipset of an electronic device such as a computing device (e.g., personal computer (PC), server) or a non-computing device (e.g., communications) device; or a machinery/embodiment (e.g., automotive) containing the electronic device.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments or components. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

As one possible variation, one or more parts of the metal walls may be made of an etch-resistant material such as nitride so that the sidewalls themselves guide formation of the air gap by resisting etching. Further, an etch-resistant material such as nitride may be provided to define a bottom of a formed air gap and provide advantageous protection to the underlying substrate from etching. Such arrangements may be particularly useful where the damascene or dual-damascene processes are applied.

What is claimed is:

1. A method of dicing a wafer comprising:
providing the wafer including an active area and an inactive area around a perimeter of the active area;
providing a cut path including a metal and a dielectric material in the inactive area and around the perimeter of the active area, wherein a top surface of the cut path includes a pattern of the metal and the dielectric material;
removing, via ablation by the laser, a portion of the cut path to form an air gap; and
cutting through the wafer within the inactive area.

2. The method of claim 1, wherein the pattern comprises a grid of the metal around the dielectric material.

3. The method of claim 1, wherein the pattern comprises a grid of the dielectric material around the metal.

4. The method of claim 1, wherein the pattern comprises strips of the metal and the dielectric material, wherein the strips are parallel to an edge of the active area.

5. The method of claim 1, wherein the pattern comprises strips of the metal and the dielectric material, wherein the strips are perpendicular to an edge of the active area.

6. The method of claim 1, further comprising:
designing the pattern based on the laser.

7. The method of claim 1, further comprising:
designing the pattern based on the metal and the dielectric material.

8. The method of claim 1, further comprising:
designing the pattern based on the laser.

9. The method of claim 1, further comprising:
providing a metal guard between the active area and the laser cut path.

10. A method of dicing a wafer comprising:
providing the wafer including a channel area between two active areas, wherein the channel area includes a dielectric material between two metal walls on the wafer and a passivation layer over the dielectric material and the metal walls;

forming a mask over the passivation layer that includes an opening over the dielectric material;

etching, via an isotropic etch, the dielectric material to form an air gap, such that the metal walls remain; and cutting through the wafer in the channel.

11. The method of claim 10, wherein the metal walls comprise smooth sidewalls.

12. The method of claim 10, wherein the metal walls comprise sidewalls having a zigzag type of vertical pattern.

13. The method of claim 10, wherein the isotropic etch comprises a wet etch process.

14. The method of claim 10, wherein the isotropic etch comprises a dry etch process.

15. The method of claim 10, further comprising:

etching the passivation layer to expose the dielectric material.

16. The method of claim 10, further comprising a metal base and a second dielectric material between the two metal walls, wherein the second dielectric material is over the wafer and the metal base is over the second dielectric material.

17. The method of claim 10, wherein cutting through the wafer comprises cutting through the wafer between the two metal walls.

* * * * *